United States Patent [19]
Ebisawa et al.

[11] Patent Number: 5,942,090
[45] Date of Patent: Aug. 24, 1999

[54] METHODS OF PRODUCING A LAMINATE

[75] Inventors: Junichi Ebisawa; Nobutaka Aomine; Yasuo Hayashi; Satoru Takaki, all of Yokohama, Japan

[73] Assignee: Asahi Glass Company Ltd., Tokyo, Japan

[21] Appl. No.: 08/834,042

[22] Filed: Apr. 11, 1997

[30] Foreign Application Priority Data

Apr. 12, 1996 [JP] Japan .................................. 8-91476

[51] Int. Cl.$^6$ .................................................. C23C 14/34
[52] U.S. Cl. .............................. 204/192.15; 204/192.26; 427/577; 427/419.2
[58] Field of Search ................ 204/192.15, 192.29, 204/192.26, 192.14, 192.16, 192.27, 192.28; 427/576, 577, 419.2, 419.3, 419.7

[56] References Cited

U.S. PATENT DOCUMENTS

| | | | |
|---|---|---|---|
| 3,669,863 | 6/1972 | Peters et al. | 204/192.26 |
| 4,096,026 | 6/1978 | Takeuchi | 204/192.15 |
| 4,462,883 | 7/1984 | Hart | 204/192.29 |
| 4,756,811 | 7/1988 | Takeoka et al. | 204/192.26 |
| 5,059,295 | 10/1991 | Finley | 204/192.26 |
| 5,110,662 | 5/1992 | Depauw et al. | 204/192.26 |
| 5,318,685 | 6/1994 | O'Shaughnessy | 204/192.26 |
| 5,420,043 | 5/1995 | Niwa | 204/192.29 |

FOREIGN PATENT DOCUMENTS

| | | |
|---|---|---|
| 0 698 585 | 2/1996 | European Pat. Off. . |
| 43 05 414 | 8/1994 | Germany . |

OTHER PUBLICATIONS

B.E. Kempf, et al., Materials Research Society Symp. Proc., vol.354, pp. 529–534, 1995, "Ion Beam Sputter Deposition Of Refractory Metal Oxides".

J. L. Vossen, et al., J. Vac. Sci. Technol. A, vol. 9, No. 3, pp. 600–603, May 1991, "Some Experiments That provide Direct Visualization of Reactive Sputtering Phenomena".

*Primary Examiner*—Nam Nguyen
*Assistant Examiner*—Brinda Raghuveer
*Attorney, Agent, or Firm*—Oblon, Spivak, McClelland, Maier & Neustadt, P.C.

[57] ABSTRACT

A method for forming an oxide film on a substrate by a sputtering process using a target comprising a metal as the main component, wherein sputtering is carried out in an atmosphere which contains a gas containing carbon atoms.

6 Claims, 11 Drawing Sheets

*1: Region in which a transparent film can be obtained

*1: Region in which a transparent film can be obtained

*1: Region in which a transparent film can be obtained

*1: Region in which a transparent film can be obtained

*1: Region in which a transparent film can be obtained

*1:
Region in which a transparent film can be obtained

METHODS OF PRODUCING A LAMINATE

The present invention relates to an oxide film which is suitable for a heat ray cut-off film for buildings or automobiles or which is suitable for a transparent conductive film for transparent electrodes, a laminate employing such oxide films, and methods for their production.

An oxide film comprising an oxide of a metal such as In, Zn or Sn as the main component, is widely used not only in the field of transparent conductive film materials but also in various other fields.

As a method for forming such an oxide film on a glass or transparent plastic substrate, a vacuum vapor deposition method, an ion plating method or a sputtering process is used. Among them, the sputtering process is a process whereby coating can be carried out at a high productivity uniformly over a large area, and it is suitable for forming a film over a large area, such as a touch panel or a liquid display element for a flat panel display.

For example, in a case where an ITO (a double oxide of indium and tin) film is to be formed by a sputtering process, there is 1) a method wherein a mixed sintered body of indium (In) oxide and tin (Sn) oxide is used as a target, and this target is subjected to sputtering, or 2) a method by so-called reactive sputtering wherein an alloy target of In and Sn is subjected to sputtering in an oxidizing atmosphere of a gas mixture of Ar and $O_2$, and film forming is carried out while oxidizing metal atoms ejected from the target.

It is well known that electrical conductivity of ITO is substantially influenced by oxygen deficiency as well as by whether or not Sn oxide doped to In oxide as the main component will effectively work as a dopant. Accordingly, control of the degree of oxidation of the film is important.

In the former method wherein a mixed sintered body of In oxide and Sn oxide is used as a target, if pure Ar is used as the sputtering gas, it is usually possible to obtain only a film showing a brown color absorption due to oxygen deficiency. In order to supplement the oxygen deficiency, it is common to carry out sputtering by adding $O_2$ a little as an oxidizing gas to the sputtering gas. However, if $O_2$ is still inadequate, a brown color-absorbing film will be obtained, and if $O_2$ is too much, the resistivity of the film will abruptly increase. Namely, in order to obtain a film having uniform properties with good reproducibility, fine control of the amount of $O_2$ incorporated is essential. Thus, due to a change with time of the pumping speed of a vacuum pump or due to a change in the $O_2$ concentration in a very small degree attributable to a change with time of the gas supply system, it has been likely that the oxidation is excessive, thus leading to a high resistivity film, or the oxidation is inadequate, thus leading to an absorbing film, and it has been difficult to obtain a film having the same properties with good reproducibility.

Further, in a case where a film is to be formed over a large area of a large-sized substrate, if a distribution occurs in the $O_2$ concentration in the chamber, in plane irregularity in the properties will result, and it has been difficult to obtain a uniform film. Thus, application of a transparent conductive film has been limited to a substrate having a small surface area.

In a conventional method, it has been almost impossible to control the resistivity of a film by adjusting the $O_2$ amount, since the resistivity increases abruptly if the $O_2$ amount is increased in order to obtain a high resistivity film.

The latter reactive sputtering process is substantially inexpensive as compared with the alloy target or a sintered target and thus has a substantial merit from the viewpoint of costs. On the other hand, the oxidation degree of a film which is substantially influential over the electrical conductivity, is controlled by the flow rate ratio of the $O_2$ gas in the sputtering with a gas mixture of Ar and $O_2$. By this control, the change from the oxidation deficient state (the state to form a film showing optical absorption) to the excessive oxidation state (the state to form a film having high resistivity) is abrupt, and the conditional range has been very narrow for the intermediate region (the region where a transparent film having low resistivity can be obtained). Further, due to an influence of the partial pressure of water as the residual gas component, it has been difficult to obtain the optimum condition constantly or with good reproducibility. Further, there has been a problem that due to a distribution or change of the condition within the apparatus, an in-plane distribution is likely to result in the resistance, the film thickness or the optical properties such as transmittance and haze, and this tendency is strong especially when a film is formed on a substrate having a large surface area. Thus, by the prior art, control of the oxidation degree to attain electrical conductivity has not been adequate, and it has not been easy to constantly obtain the condition for good electrical conductivity. Further, for application to a substrate having a large surface area, an improvement in the in-plane uniformity of electrical properties and optical properties has been desired.

Further, if it is attempted to obtain an electrical conductive thin film having high resistivity by controlling the resistance, the resistivity is likely to change excessively due to the oxidation state, and it has been difficult to attain the desired high resistance constantly and with a uniform in-plane distribution.

On the other hand, an oxide film comprising ZnO or $SnO_2$ as the main component is preferably used, for example, as a heat ray cut-off film.

As a film construction of a heat ray cut-off film to be used for buildings or automobiles, 1) a film having three layers of an oxide film, a Ag film and an oxide film sequentially laminated from the substrate side, or 2) a film having five layers of an oxide film, a Ag film, an oxide film, a Ag film and an oxide film sequentially laminated from the substrate side, is known. Such a heat ray cut-off film is called a Low-E (Low-Emissivity) film, and a glass having this film formed thereon is called a Low-E glass.

As a main Low-E glass, the one having a film construction of ZnO, Ag and ZnO sequentially laminated on a glass substrate, is available, and is usually used as a double glazing or a laminated glass. However, this film construction has a problem with respect to moisture resistance, and there is a problem in the storage stability or handling efficiency, since white spots are likely to form due to moisture in the environment during the storage of single plates after film formation before the step for double glazing or lamination.

As described in JP-A-4-357025, it is known that in order to improve the moisture resistance of Low-E glass, reduction of the internal stress of the uppermost oxide layer is effective. As an oxide film with a low internal stress, 1) a tin oxide film, or 2) a ZnO film having other element having an ion radius smaller than $Zn^{2+}$ in an oxidized state (such as Al, Si, B, Sn, Mg or Cr) incorporated, is, for example, disclosed.

In a case where a laminate employing the above $SnO_2$ film or the ZnO film, is to be formed by a large size film forming apparatus to be used for production of glasses for buildings or automobiles, even if the above-mentioned oxide film is selected for use, the internal stress of the oxide film can not sufficiently be reduced, since the amount of water remaining in the sputtering apparatus is substantial. As a result, the moisture resistance of the obtained laminate has been often inadequate, and an improvement has been desired.

It is an object of the present invention to provide (1) an oxide film having an internal stress lower than heretofore and a method for its production, (2) a laminate employing such an oxide film so that the moisture resistance is further improved, and the storage and handling efficiency in the form of single plates are further facilitated, and a method for its production, and (3) a method for producing an oxide film, whereby the desired electrical properties and optical properties can be constantly obtained in a good in-plane distribution.

The present invention provides a method for forming an oxide film on a substrate by a sputtering process using a target comprising a metal as the main component, wherein sputtering is carried out in an atmosphere which contains a gas containing carbon atoms.

Figure 1:
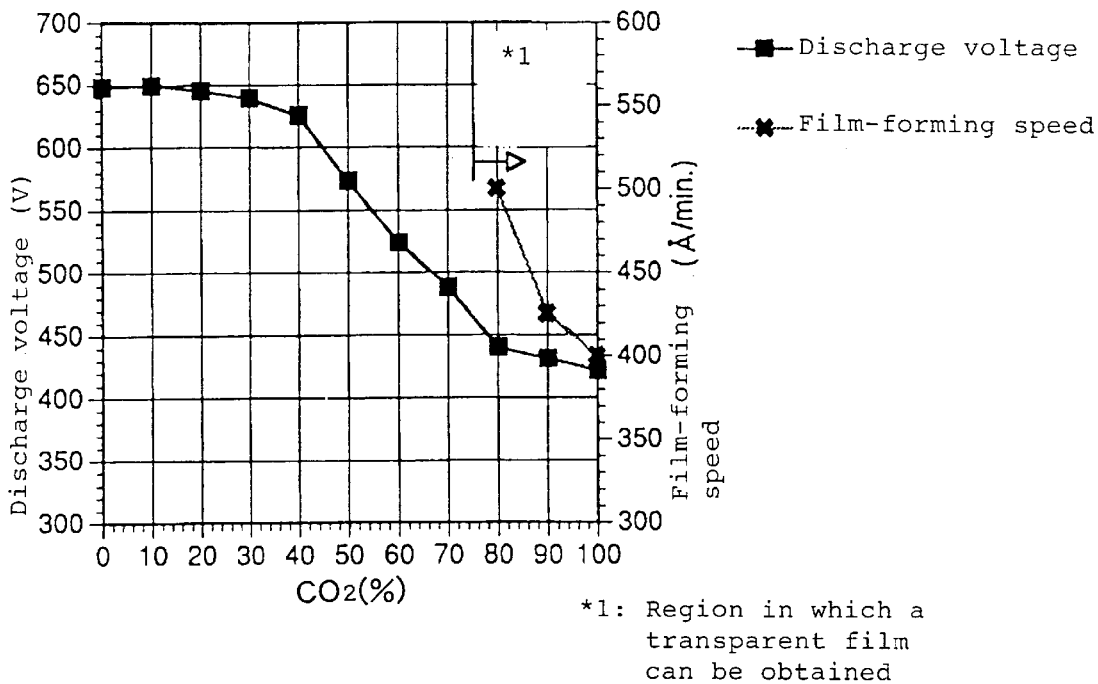
FIG. 1 is a graph showing a relation of the discharge voltage vs the reactive gas ($CO_2$) flow rate ratio and a relation of the film-forming speed (the film-forming speed during formation of a transparent film) vs the reactive gas ($CO_2$) flow rate ratio, with respect to the carbon-containing $ZnO_x$, film of Example 1.

Now, the present invention will be described in detail with reference to the preferred embodiments.

In the present invention, the sputtering process is not particularly limited, and a RF (high frequency) magnetron sputtering process or a DC (direct current) magnetron sputtering process may, for example, be mentioned. The DC magnetron sputtering process is suitable for forming a laminate uniformly at low costs with good productivity on a substrate for an application where a large area is required, such as glass for buildings, automobiles or vehicles.

As the target comprising a metal as the main component, it is preferred to employ a target comprising, as the main component, at least one metal selected from the group consisting of Zn, Sn, In, Al and Ti.

The effect of incorporating carbon is particularly remarkable with an oxide film comprising, as the main component, an oxide of at least one metal selected from the group consisting of Zn, Sn and In. Accordingly, it is particularly preferred to employ a target comprising, as the main component, at least one metal selected from the group consisting of Zn, Sn and In.

The present invention provides an oxide film (hereinafter referred to as a low stress oxide film) which is an oxide film comprising an oxide of a metal selected from the group consisting of Zn, Sn, In, Al and Ti as the main component and which is characterized by containing carbon.

The proportion of carbon is preferably from 0.03 to 15 atomic % by atomic ratio to the total amount of at least one metal selected from the group consisting of Zn, Sn, In, Al and Ti, with a view to reducing the internal stress. It is particularly preferably from 0.03 to 5 atomic %.

In the present invention, the above oxide film is preferably an oxide film comprising, as the main component, an oxide of at least one metal selected from the group consisting of Zn, Sn and In, since the effects will thereby be remarkable. Said oxide film preferably contains also at least one metal selected from the group consisting of Al, Ga, Si and Ti. With a view to reducing the internal stress, the total amount of such metals is preferably from 0.1 to 10 atomic % to the total amount of at least one metal selected from the group consisting of Zn, Sn and In. The present invention is suitably applicable to the above-mentioned transparent conductive film.

An oxide film usually has a compression stress. With a Low-E film, it is known that if the internal stress of the oxide film, especially the oxide film of the outermost layer, is large, cracks are likely to form in the oxide film, and moisture penetrated through the cracks will corrode the metal (particularly Ag) layer. By using a low stress oxide film of the present invention, moisture from outside scarcely penetrates and diffuses into the oxide film of the outermost layer, whereby the metal layer is scarcely susceptible to an influence of moisture in the external atmosphere, and thus, the moisture resistance of the Low-E film will be improved.

The present invention provides a laminate having oxide films and metal film(s) alternately laminated on a substrate in a total of (2n+1) layers (n≧1 i.e. n is an integer of at least 1), wherein at least one layer among the oxide films is the above-mentioned low stress oxide film, and a method for its production.

The number of layers of a laminate can generally be represented by (2n+1) layers (n≧1), as an oxide film, a metal film and an oxide film, and a further repetition of a metal film and an oxide film, are sequentially laminated, and any number of layers may be employed. In reality, however, if at least seven layers are laminated, the visible ray transmittance tends to be low for use for windows for buildings, automobiles or railroad vehicles. Therefore, practically, 1) a three layer system comprising an oxide film, a metal film and an oxide film, or 2) a five layer system comprising an oxide film, a metal film, an oxide film, a metal film and an oxide film, is preferred.

The low stress oxide film of the present invention may be used for a part or whole of oxide films of a laminate depending upon the requirements or restrictions with respect to the productivity, the costs of materials, the durability and the constitution of production equipments.

By using the low stress oxide film of the present invention for at least one layer among the oxide films in the laminate, when such a laminate is used as a heat ray cut-off film, the moisture resistance will be improved, and storage and handling in the form of single plates can be facilitated. It is particularly preferred to use such low stress oxide film as the oxide film of the (2n+1)th layer.

As a specific example of such a low stress oxide film, an oxide film may be mentioned which comprises oxides of Zn and Sn as the main components and which contains carbon, wherein Sn is contained in an amount of from 0.1 to 90 atomic % to the total amount of Zn and Sn. It is particularly preferred to use such an oxide film as the oxide film of the (2n+1)th layer.

As another specific example of such a low stress oxide film suitable for the (2n+1)th layer, an oxide film (a Si—Sn type low stress oxide film) may be mentioned which comprises oxides of Si and Sn and which contains carbon. In this case, the film preferably contains from 0.1 to 90 atomic % of Si to the total amount of Sn and Si.

Further, for the purpose of improving the physical durability and chemical durability, it is preferred to form an overcoat film which comprises an oxide of Sn as the main component and which contains from 5 to 95 atomic % of Si to the total amount of Sn and Si, on the oxide film of the (2n+1)th layer of the above-mentioned laminate. Such an overcoat film is particularly effective when the oxide film of the (2n+1)th layer is an oxide film different from the above-mentioned Si—Sn type low stress oxide film. Such an overcoat film may contain from 0.03 to 15 atomic % of carbon to Sn.

As the metal films in the laminate, it is preferred to employ metal films comprising Ag as the main component from the viewpoint of e.g. the heat ray reflecting property. Further, to improve their durability, it is preferred to incorporate at least one metal selected from the group consisting of Pd, Au and Cu, particularly Pd. The proportion of said metal is preferably from 0.1 to 10 atomic % to Ag.

The laminate of the present invention may have 1) another layer such as a barrier layer (a layer to prevent oxidation of the metal layer) or an adhesive-improving layer interposed between the metal film and the oxide film, or 2) another layer such as an alkali barrier layer (a layer to prevent diffusion of an alkali component in the substrate) or an adhesion-improving layer interposed between the substrate and the oxide film.

The substrate to be used in the present invention is not particularly limited, and a glass plate, a plastic sheet or a plastic film may, for example, be mentioned.

A transparent electrode can be prepared by forming the low stress oxide film of the present invention on a substrate. Such a transparent electrode is suitable for use as a transparent electrode for a touch panel or as a transparent electrode for a liquid display device. When it is used as a transparent electrode for a touch panel, the resistance of the sheet is preferably adjusted to a level of from 200 Ω/□ to 2 kΩ/□.

Further, according to the method of the present invention, it is possible to prevent absorption due to oxidation of the metal film (particularly the Ag film) previously formed and to constantly produce an oxide film free from absorption. Accordingly, decrease in the transmittance is small, and it is suitable for application to an electromagnetic shielding plate which requires an extremely low resistance at a level of at most 4 Ω/□.

Further, oxidation of the metal film can be suppressed, whereby its reliability will be high when it is used for application to an electrically heated glass wherein the metal film is used as a heat-generating film.

The flow rate of the sputtering gas used in the present invention varies depending upon the sputtering condition. For example, when the target size is 4 inches, the flow rate of the sputtering gas is preferably from 10 to 100 sccm.

The sputtering condition depends on the conditions of the apparatus, such as the volume of the sputtering film-forming chamber, the surface area of the target, the pumping speed of the vacuum pump, the flow rate of the feed gas, and positioning of the target and the substrate.

A specific example will be described. Prior to film-forming, the interior of the chamber is evacuated to a vacuum degree of $2 \times 10^{-5}$ Torr. Using a 6 inch target, a direct current power of 500 W is applied to the metal Zn target at a flow rate of $CO_2$ introduced as a sputtering gas into a chamber being 35 sccm under a sputtering pressure of $2 \times 10^{-3}$ Torr, whereby a transparent carbon-containing ZnO film (hereinafter referred to as a C:ZnO film) can be obtained at a film-forming speed of 35 nm/min. Using the same film-forming apparatus, if $O_2$ gas is used as a sputtering gas at the same flow rate instead of the $CO_2$ gas, a transparent ZnO film can be likewise obtained at a film-forming speed of 34 nm/min.

The internal stress of the obtained film was $1.6 \times 10^{10}$ dyn/cm$^2$ (compression) with the C:ZnO film, which is sufficiently low as compared with $2.0 \times 10^{10}$ dyn/cm$^2$ (compression) of the ZnO film formed by using the $O_2$ gas.

Another example will be described. Using a 4 inch target, a direct current power of 100 W is applied to an In—Sn alloy target (containing 10 wt % of Sn as calculated as Sn oxide) at a flow rate ratio of Ar and $CO_2$ introduced as sputtering gases into the chamber being 8:92 (the flow rates being 30 sccm) under a sputtering pressure of $3 \times 10^{-3}$ Torr, whereby a transparent conductive film made of ITO having a resistivity of $2.7 \times 10^{-4}$ Ω cm can be obtained at a film-forming speed of 35 nm/min on a glass substrate heated to 250° C.

Using the same film-forming apparatus, if the sputtering gas is changed to a gas mixture of Ar and $O_2$, a transparent ITO film having a resistivity of $3.5 \times 10^{-4}$ Ω cm can be obtained at a film-forming speed of 33 nm/min when the flow rate ratio of Ar and $CO_2$ is 54:46.

Figure 9:
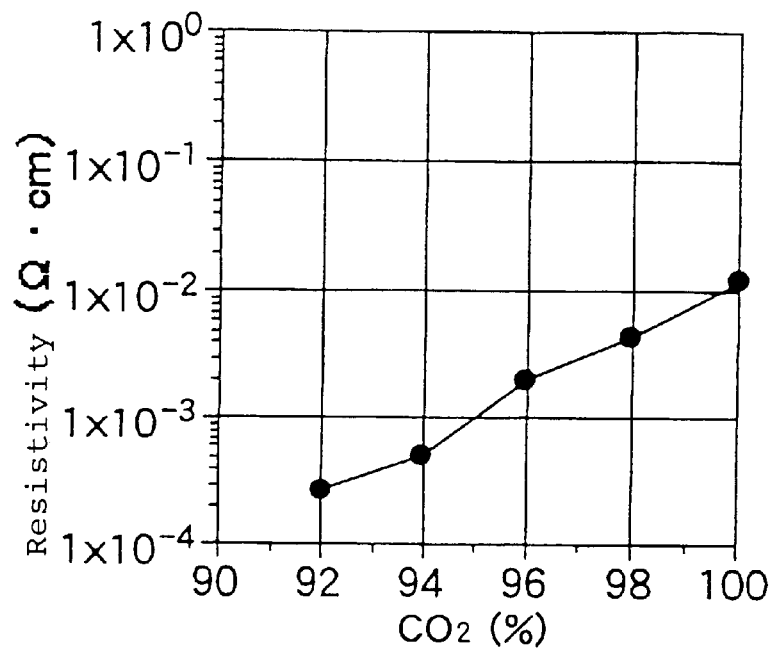
FIG. 9 is a graph showing a relation between the $CO_2$ flow rate ratio and the resistivity.
Figure 10:
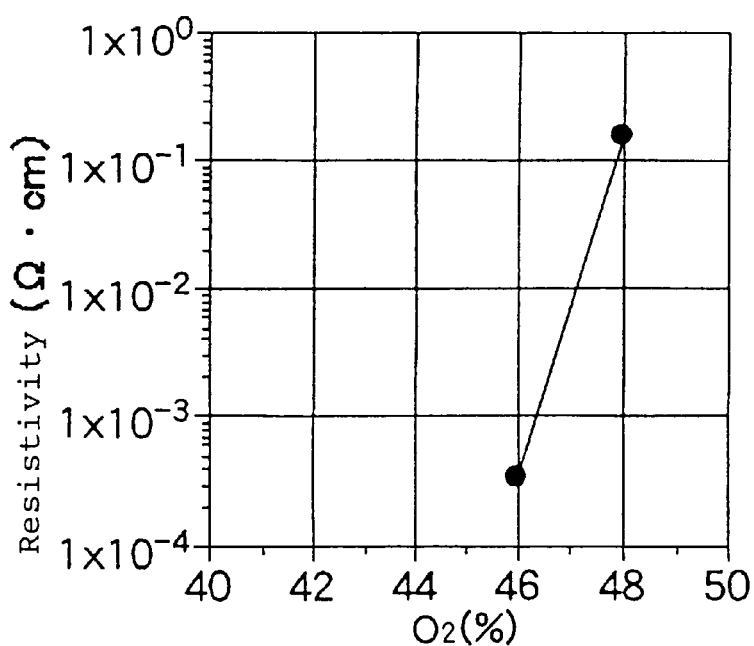
FIG. 10 is a graph showing a relation between the $O_2$ flow rate ratio and the resistivity.

FIG. 9 shows a relation between the $CO_2$ flow rate ratio (i.e. the $CO_2$ flow rate to the total flow rate of Ar and $CO_2$) and the resistivity of the obtained transparent film, and FIG. 10 shows a relation between the $O_2$ flow rate ratio and the resistivity of the obtained transparent film.

As is evident from comparison of FIGS. 9 and 10, when a gas mixture of Ar and $CO_2$ is used, a film having the same low resistivity can be obtained in a wider range, as compared with a case where a gas mixture of Ar and $O_2$ is used.

In the case of an ITO film, it is preferred to carry out film forming so that the proportion of carbon will be from 0.03 to 5 atomic % to the total amount of In and Sn. If it is less than 0.03 atomic %, the effect of incorporating carbon is small, and if it exceeds 5 atomic %, optical absorption of a brown color due to free carbon atoms tends to be not negligible, whereby it tends to be problematic in application as a transparent conductive film. It is particularly preferably from 0.1 to 3 atomic %.

The proportion of Sn is preferably from 4 to 16 wt %, as calculated as Sn oxide, to the total amount of In oxide and Sn oxide. If it is less than 4 wt %, it tends to be difficult to obtain a film having a low resistance. If it exceeds 16 wt %, etching residue of Sn oxide is likely to form when etching is carried out in the subsequent step. It is particularly preferably from 7 to 13 wt %.

In the present invention, a gas containing carbon atoms (hereinafter referred to simply as a C-containing gas) is used as a part or whole of the sputtering gas. The C-containing gas may, for example, be $CO_2$, CO, $CH_4$, $C_2H_6$, $C_2H_4$, $C_2H_2$, $CH_3OH$, $C_2H_5OH$ or $C_3H_7OH$. Preferred is (1) $CO_2$, (2) a gas mixture of $CO_2$ and Ar, or (3) a gas mixture of $CO_2$, Ar and $O_2$. $CO_2$ is particularly suitable for use on an industrial scale, since it is inexpensive and easy to handle as it is free from explosion, flammability or toxicity.

When sputtering is carried out with a gas mixture of $CO_2$ and Ar, the proportion of $CO_2$ to the entire gas flow rate is preferably at least 50%. If the proportion of $CO_2$ is less than 50%, metal atoms ejected from the target by sputtering are likely to be taken into the film in a metallic state without being adequately oxidized, and the resulting film tends to be a colored film.

$O_2$, $N_2O$ or the like may be combined with $CO_2$ and used as a reactive gas. In such a case, the proportion of the total reactive gas is preferably at least 50% for the same reason as mentioned above.

In the sputtering process, a high electrical field is applied to the target, and ions thereby generated in a glow discharge state are utilized for a film-forming process. In such a glow discharge atmosphere, various active species will form by electrolytic dissociation of the gas.

By decomposition of the C-containing gas or its reaction with an oxidizing gas, various reducing gas components including CO gas will form, and carbon atoms or a compound containing carbon atoms will be taken into the growing film, whereby the oxide film will not be in an oxygen excessive state during its growth, and the crystal growth direction of the film will be uniform and the film will be densified so that the internal stress will be reduced.

By carrying out sputtering in $CO_2$ or in a gas mixture of Ar and $CO_2$, it is possible to constantly secure a region (a so-called transition region) wherein a transparent film can be obtained at the maximum film-forming speed. In the sputtering film-forming atmosphere, presence of CO as a reducing gas has been confirmed, and it is believed that not only an oxidizing reaction but also a reducing reaction by CO gas is taking place simultaneously. These reactions are well balanced so that the entire reaction proceeds mildly to present a constant transition region.

Namely, crystal growth of the film proceeds in a weakly oxidizing atmosphere in a not excessively oxidizing state. Further, inclusion of H which hinders crystal growth is suppressed. Accordingly, in the film, defects due to excessive oxygen will decrease, and the internal stress of the film will be reduced. Such effects are particularly remarkable in the case of a $SnO_2$ film or a ZnO film.

On the other hand, the degree of oxidation of the oxide film, which is a factor determining electrical conductivity, is controlled by the pressure or the flow rate ratio of the oxidizing gas. For example, in the case of sputtering with a gas mixture of $Ar/CO_2$, the degree of oxidation can be controlled by changing the flow rate ratio of $CO_2$. In a case of sputtering with 100% $CO_2$, the degree of oxidation can be controlled by adjusting the sputtering pressure by increasing or reducing the flow rate of $CO_2$ or pumping speed of vacuum pump by a conductance valve or the like.

More specifically, the oxidizing property of the atmosphere can be increased by 1) increasing the flow rate ratio of $O_2$, 2) increasing the flow rate ratio of $CO_2$ or 3) increasing the flow rate of $CO_2$ or reducing the pumping speed of vacuum pump, whereby the degree of oxidation of the oxide film can be increased.

When the substrate is heated during film-formation, the oxidation reaction can effectively and stably be proceeded.

The C-containing gas or formed CO in the sputtering gas is activated by glow discharge and oxidized to form $CO_2$. Further, carbon atoms or bonds containing carbon atoms formed on the film surface will be oxidized and will leave from the film in the form of a gas (an oxidized gas). Namely, it is considered that the above-mentioned CO or oxidized gas serves as a reducing agent and will cause, for example, a reaction in the reduction direction, such as from the In oxide to a lower In oxide or metal In.

The reaction in the reduction direction is coexistent with the reaction in the oxidation direction, whereby the change of the film properties against the film-forming condition tends to be mild, and it becomes easy to control it. Accordingly, it is considered that 1) the optimum condition can easily be attained, and 2) even against a change in the condition or an in-plane variation, the reproducibility, stability and in-plane uniformity of the properties can be substantially improved. The degree of oxidation of the resulting oxide film (i.e. the resistivity) will finally be determined by the balance of the above-mentioned oxidation and reduction. According to the present invention, the degree of oxidation can easily be controlled.

According to the present invention, 1) a film having a low resistivity comparable to a conventional sputtering process with a gas mixture of $Ar/O_2$, is obtainable, and 2) it is also possible to form a film having a higher resistivity under good controllability.

Accordingly, it is theoretically effective to introduce CO as a reducing gas. However, CO is a toxicic gas, and a difficulty is involved in the practical use on an industrial scale.

On the other hand, in a conventional sputtering process with a gas mixture of $Ar/O_2$, nodules tend to form on the target of Zn, Sn, In or the like, thus leading to problems such as variation of the resistance, lack of in-plane uniformity or formation of arcing.

Arcing is a phenomenon in which the oxide film formed on the surface of the target or a powder of the film material formed in the film-forming chamber, is electrified, and when the accumulated electric charge has exceeded in a certain threshold value, it is discharged all at once. By an overcurrent thereby generated, the protecting circuit of the sputtering power source is actuated to stop discharging, or the target material is locally melted and scattered, thus causing spitting or pin holes on the substrate or causing defects such as irregularity in the film thickness.

$CO_2$ has an oxidizing power weaker than $O_2$, whereby the oxidized film formed on the target surface or the powder formed in the film-forming chamber tends to be an oxygen deficient state and tends to have electrical conductivity, whereby the electric charge tends to hardly accumulate and thus arcing can effectively be prevented.

Namely, by using the method of the present invention, formation of nodules can be reduced, and the above problem can be solved.

For example, reducing CO, $CH_4$, $C_2H_6$, $C_2H_4$ or $C_2H_2$ may be mixed to the atmosphere containing $O_2$. However, it is preferred to use $CO_2$ or a gas mixture of Ar and $CO_2$, for such reasons that 1) it is free from toxicity or explosion, 2) the condition can be simplified by reducing the types of the starting material gases, and 3) the raw materials are available at low costs.

On the other hand, as a method for effectively suppressing arcing which is likely to occur due to accumulation of electric charge on an oxide film formed on e.g. a target surface, a sputtering process wherein a sputtering power is intermittently applied (a pulse sputtering process), is known.

By using the pulse sputtering process for sputtering, it is possible to further increase the film forming stability or the yield of the products.

Further, when an oxide film is to be formed by a conventional method (a reactive sputtering process in a gas mixture of Ar and $O_2$, or in a gas atmosphere of $O_2$), an oxidation barrier layer (a thin film of a metal such as Zn or Ti) is inserted to prevent oxidation of the Ag film immediately below during forming of the oxide film. The barrier layer is very thin, and setting of the condition is difficult. Further, in the practical production, even after the condition has once been set, adjustment of the condition has been frequently required, since the thickness changes due to a delicate change in the film-forming condition. Further, a very thin metal film tends to form discontinuous island-shaped films, whereby oxidation of the Ag layer has not been completely prevented.

Oxidation of the Ag layer can be prevented by forming the oxide film by sputtering a conductive oxide target in an Ar gas atmosphere (or an Ar gas atmosphere having a very small amount of $O_2$ incorporated). However, the oxide target is very expensive as compared with a metal target, and such a method is industrially disadvantageous from the viewpoint of the cost of the target.

According to the present invention, when an oxide film is formed on a Ag film, oxidation of the Ag layer is prevented by the use of $CO_2$ gas having a mild oxidizing power, whereby visible ray transmittance higher than a conventional method can be obtained. Further, by selecting the condition for $CO_2$ sputtering, an oxide film may be laminated on the Ag film even without employing a barrier layer.

Now, the present invention will be described in further detail with reference to Examples and Comparative Examples. However, it should be understood that the present invention is by no means restricted to such specific Examples.

EXAMPLE 1 and COMPARATIVE EXAMPLE 1

A $C:ZnO_x$ (carbon containing $ZnO_x$) film (100 nm) or a $C:ZnAl_xO_y$ (carbon containing $ZnAl_xO_y$) film (100 nm) was formed by DC sputtering on a substrate of thoroughly cleaned soda lime silica glass (10 cm×10 cm×2 mm in thickness), using a rectangular metal target of 5×17 inches in an atmosphere of a gas mixture of Ar and $CO_2$ under a pressure of $2\times10^{-3}$ Torr. The $C:ZnAl_xO_y$ film was formed by using a target having 3 atomic % of Al incorporated in Zn (Example 1).

Figure 2:
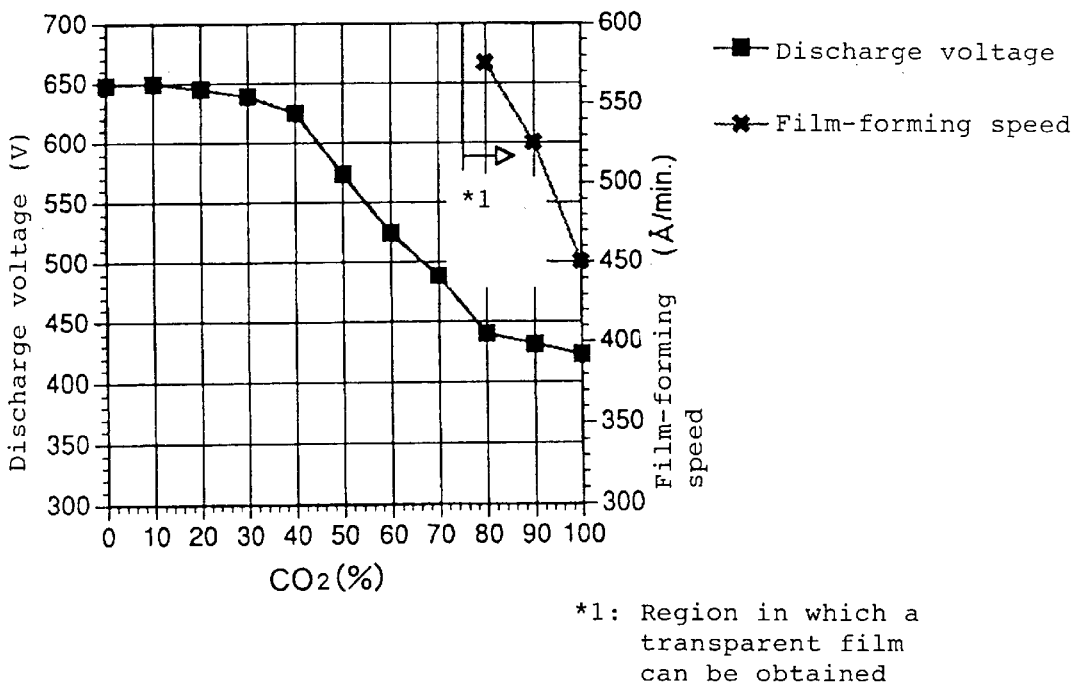
FIG. 2 is a graph showing a relation of the discharge voltage vs the reactive gas ($CO_2$) flow rate ratio and a relation of the film-forming speed (the film-forming speed during formation of a transparent film) vs the reactive gas ($CO_2$) flow rate ratio, with respect to the carbon-containing $ZnAl_xO_y$ film of Example 1.

FIG. 1 is a graph showing a relation of the discharge voltage vs the reactive gas ($CO_2$) flow rate ratio and a relation of the film-forming speed (the film-forming speed during formation of a transparent film) vs the reactive gas ($CO_2$) flow rate ratio, with respect to the $C:ZnO_x$ film. FIG. 2 is a graph showing a relation of the discharge voltage vs the reactive gas ($CO_2$) flow rate ratio and a relation of the film-forming speed (the film-forming speed during formation of a transparent film) vs the reactive gas ($CO_2$) flow rate ratio, with respect to the $C:ZnAl_xO_y$ film. Here, the gas flow rate was 100 sccm.

As comparative samples, a $ZnO_x$ film (100 nm) and a $ZnAl_xO_y$ film (100 nm) were formed in the same manner as in Example 1 except that the sputtering was carried out in an atmosphere of a gas mixture of Ar and $O_2$, as the prior art (Comparative Example 1).

Figure 3:
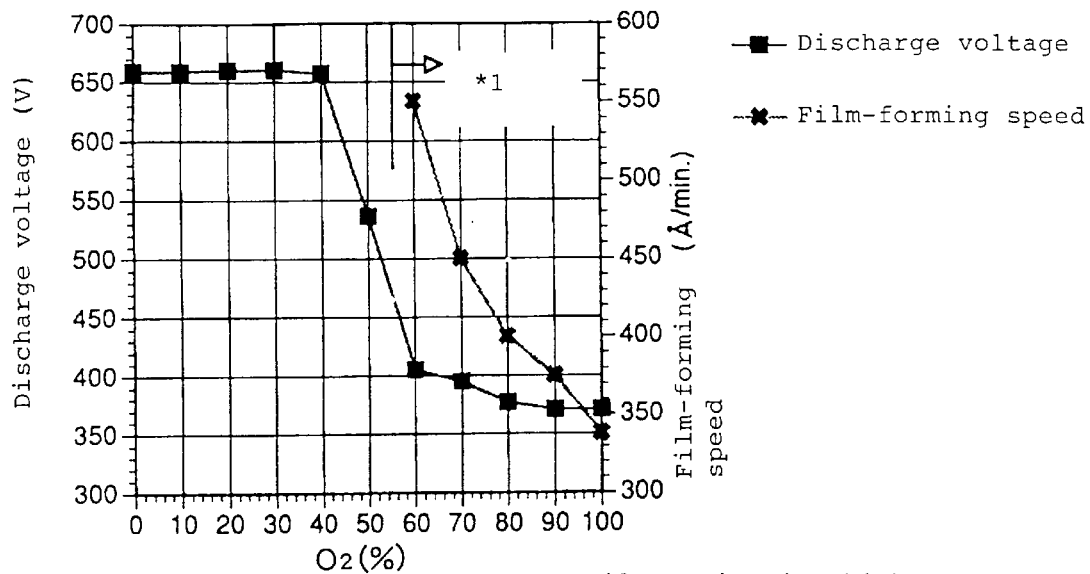
FIG. 3 is a graph showing a relation of the discharge voltage vs the reactive gas ($O_2$) flow rate ratio and a relation of the film-forming speed (the film-forming speed during formation of a transparent film) vs the reactive gas ($O_2$) flow rate ratio, with respect to the $ZnO_x$ film of Comparative Example 1.
Figure 4:
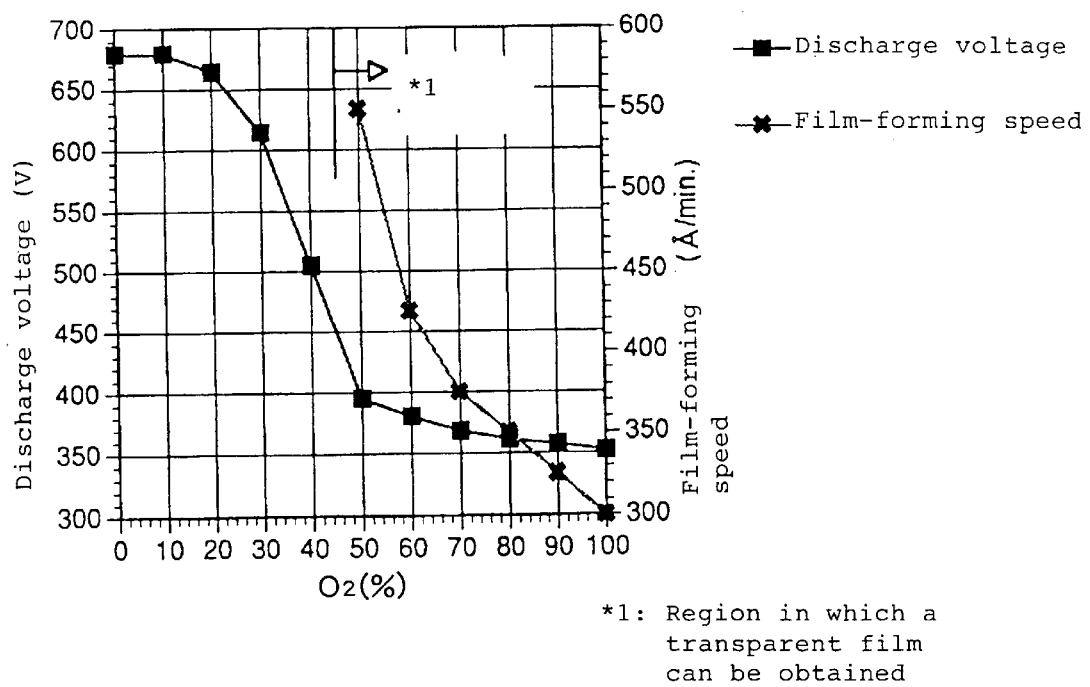
FIG. 4 is a graph showing a relation of the discharge voltage vs the reactive gas ($O_2$) flow rate ratio and a relation of the film-forming speed (the film-forming speed during formation of a transparent film) vs the reactive gas ($O_2$) flow rate ratio, with respect to the $ZnAl_xO_y$ film of Comparative Example 1.

FIG. 3 is a graph showing a relation of the discharge voltage vs the reactive gas ($O_2$) flow rate ratio and a relation of the film-forming speed (the film-forming speed during formation of a transparent film) vs the reactive gas ($O_2$) flow rate ratio, with respect to the $ZnO_x$ film of Comparative Example 1. FIG. 4 is a graph showing a relation of the discharge voltage vs the reactive gas ($O_2$) flow rate ratio and a relation of the film-forming speed (the film-forming speed during formation of a transparent film) vs the reactive gas ($O_2$) flow rate ratio, with respect to the $ZnAl_xO_y$ film of Comparative Example 1.

From comparison of FIGS. 1 and 3 and FIGS. 2 and 4, it is evident that when $CO_2$ gas was used, the film-forming speed is larger in a conditional region wherein a transparent film can be constantly obtained (a region where the change in the discharge voltage relative to the reactive gas concentration is small, e.g. a region in FIG. 1 where the $CO_2$ concentration is at least 80%), in either case of $ZnO_x$ or $ZnAl_xO_y$.

By the conventional method, film forming in the vicinity of a transition region where the film-forming speed of a transparent film is high (a region where a transparent film begins to form instead of an absorbing film) is difficult since the change in the discharge voltage relative to the change in the amount of the reaction gas is so large that the desired film-forming speed can not constantly be obtained. Whereas, according to the present invention, it was easy to carry out film forming constantly in the vicinity of the transition region where the film-forming speed of the transparent film was high, since $CO_2$ has an oxidizing power smaller than $O_2$, and oxidation of the target was suppressed.

Figure 5:
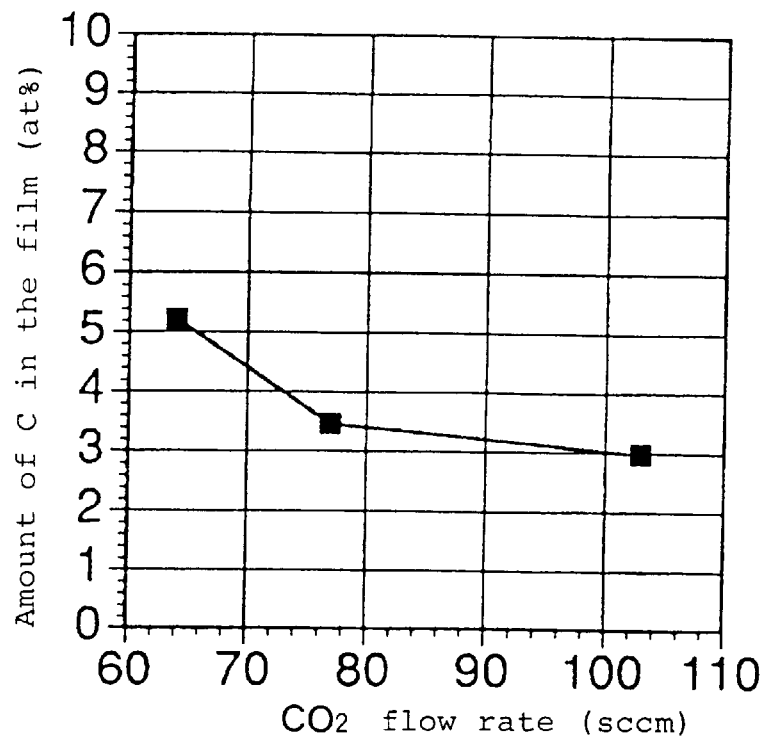
FIG. 5 is a graph showing the amount of C taken into the ZnO film when the flow rate of $CO_2$ (100%) as the sputtering gas was changed in Example 1.

ZnO does not substantially form a carbide. However, as $CO_2$ is used as the sputtering gas, C will be taken into the ZnO film or the $ZnAl_xO_y$ film. FIG. 5 is a graph showing the amount of C taken into the ZnO film (the proportion (atomic %) of carbon to Zn) when the flow rate of $CO_2$ (100%) as the sputtering gas was varied in Example 1.

Figure 6:
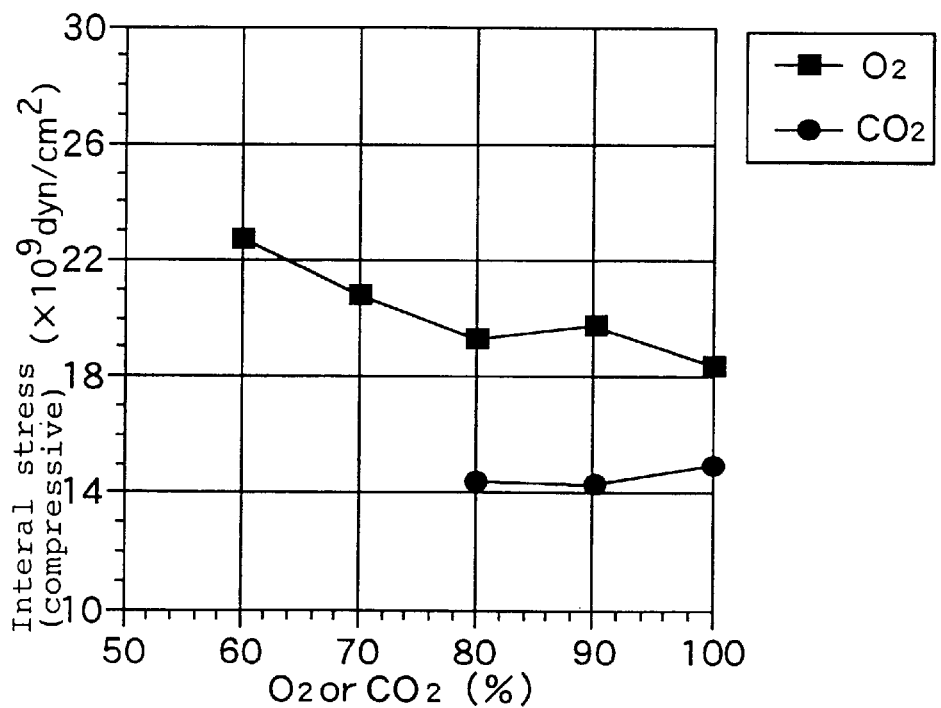
FIG. 6 is a graph showing a relation between the internal stress (transparent region) vs the reactive gas flow rate ratio ($CO_2$ or $O_2$) with respect to the ZnO film.
Figure 7:
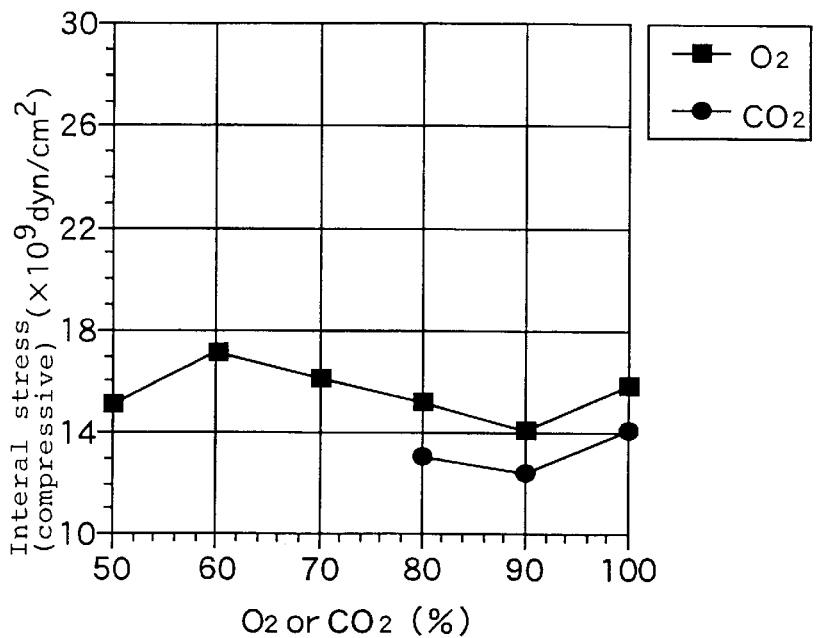
FIG. 7 is a graph showing a relation of the internal stress (transparent region) vs the reactive gas flow rate ratio ($CO_2$ or $O_2$) with respect to the $ZnAl_xO_y$ film.

FIG. 6 is a graph showing a relation of the internal stress (transparent region) vs the reactive gas flow rate ratio ($CO_2$ or $O_2$) with respect to the (C:)ZnO film. Likewise, FIG. 7 is a graph showing a relation of the internal stress (transparent region) vs the reactive gas flow rate ratio ($CO_2$ or $O_2$) with respect to the (C:)$ZnAl_xO_y$ film. In either case of the C:$ZnO_x$ film or the C:$ZnAl_xO_y$ film, the internal stress is reduced over the entire transparent region.

EXAMPLES 2 TO 7 and COMPARATIVE EXAMPLES 2 TO 5

Using the same apparatus as used in Example 1, films were formed by DC sputtering on a substrate of thoroughly cleaned soda lime silica glass (10 cm×10 cm×2 mm in thickness) to have a film structure as identified in Table 1, to obtain various laminates. The film-forming condition for each film is as identified in Table 2.

The $CO_2$ flow rate during formation of the C:$ZnAl_xO_y$ film was 67 sccm in Examples 2, 4 and 6 and 103 sccm in Examples 3 and 5. The gas mixture of Ar and $O_2$ used, was composed of 20 sccm of Ar and 80 sccm of $O_2$.

In Table 1, "G" means soda lime silica glass (10 cm×10 cm×2 mm in thickness). In Table 2, "gas" means the gas of the sputtering atmosphere, and "pressure" means the pressure during sputtering. Further, "Zn-3 at % Al" is meant for a target having 3 atomic % of Al incorporated in Zn, and "Ag-1 at % Pd" is meant for a target having 1 atomic % of Pd incorporated in Ag. Further, "Sn-50 at % Si" is meant for a target having 50 atomic % of Si incorporated in Sn (i.e. Sn:Si=1:1). The content of carbon in the C:$SnSi_xO_y$ film (the content of carbon to the total amount of Sn and Si) was about 3.5 atomic %.

EXAMPLES 2 AND 3 AND COMPARATIVE EXAMPLE 2

The visible ray transmittance (Tv) of Examples 2 and 3 was 84%, and Tv of Comparative Example 2 was 78%.

Figure 8:
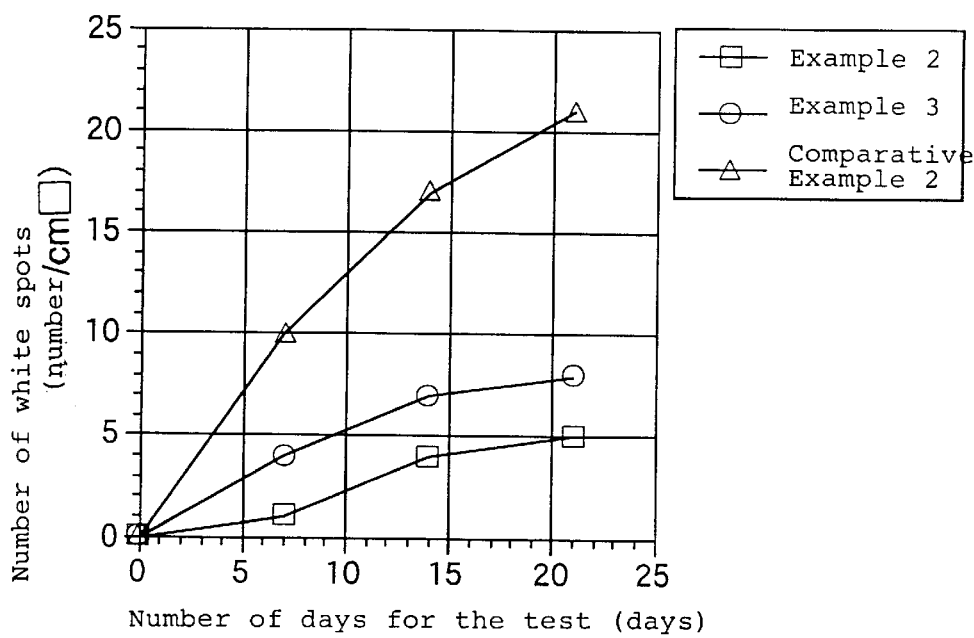
FIG. 8 is a graph showing the results of constant temperature and humidity tests of the respective laminated film samples of Examples 2 and 3 and Comparative Example 2.

With respect to each of samples of Examples 2 and 3 and Comparative Example 2, a constant temperature and humidity test (maintained in a constant temperature tank at a temperature of 40° C. under a humidity of 90% for 3 weeks) was carried out, whereby as shown in FIG. 8, the samples of Examples 2 and 3 showed excellent moisture resistance with the number of white spots (number/cm□) being smaller than the sample of Comparative Example 2.

EXAMPLES 4 AND 5 AND COMPARATIVE EXAMPLE 3

With respect to each of samples of Examples 4 and 5 and Comparative Example 3, the same constant temperature and humidity test as described above was carried out, and the results are shown in Table 3. In Table 3, the number is the number of white spots (number/cm□).

EXAMPLE 6 AND COMPARATIVE EXAMPLE 4

As a durability test with respect to Example 6 and Comparative Example 4, a scratch test was carried out by means of a scratch tester "HEIDON-18", manufactured by HEIDON Co. A sapphire stylus having a diameter of 0.2 mm was scanned on the film surface while increasing the load from 0 to 200 g, whereby the critical load for peeling of the film was measured five times for each. As a result, with respect to Example 6, the critical load was 174±11 g, and with respect to Comparative Example 4, it was 120±8 g. Thus, Example 6 had a larger critical load for peeling the film than Comparative Example 4, and showed adequate scratch resistance.

EXAMPLE 7 AND COMPARATIVE EXAMPLE 5

With respect to Example 7 and Comparative Example 6, a scratch test was carried out in the same manner as in Example 6. With the sample of Comparative Example 5, the critical load was 180±5 g, while with the sample of Example 7, the film was not peeled even at a critical load of 200 g.

TABLE 1

Numerals in brackets ( ) are geometrical film thicknesses (nm)

| | |
|---|---|
| Example 2 | G/$ZnAl_xO_y$(16)/Ag—Pd(10)/C:$ZnAl_xO_y$(38) |
| Example 3 | G/$ZnAl_xO_y$(16)/Ag—Pd(10)/Zn—Al(2)/C:$ZnAl_xO_y$(38) |
| Example 4 | G/C:ZnO(16)/Ag(10)/C:ZnO(38) |
| Example 5 | G/C:ZnO(16)/Ag(10)/Zn(2)/C:ZnO(38) |
| Example 6 | G/C:$ZnAl_xO_y$(31)/Ag—Pd(10)/C:$ZnAl_xO_y$(63)/ Ag—Pd(10)/C:$ZnAl_xO_y$(24) |
| Example 7 | G/C:$ZnAl_xO_y$(31)/Ag—Pd(10)/C:$ZnAl_xO_y$(63)/ Ag—Pd(10)/C:$ZnAl_xO_y$(14)/C:$SnSi_xO_y$(10) |
| Comparative Example 2 | G/$ZnAl_xO_y$(16)/Ag—Pd(10)/Zn—Al(2)/$ZnAl_xO_y$(38) |
| Comparative Example 3 | G/ZnO(16)/Ag(10)/Zn(2)/ZnO(38) |
| Comparative Example 4 | G/$ZnAl_xO_y$(31)/Ag—Pd(10)/Ti(2)/$ZnAl_xO_y$(63)/ Ag—Pd(10)/Ti(2)/$ZnAl_xO_y$(24) |
| Comparative Example 5 | G/$ZnAl_xO_y$(31)/Ag—Pd(10)/Ti(2)/$ZnAl_xO_y$(63)/ Ag—Pd(10)/Ti(2)/$ZnAl_xO_y$(14)/$SnSi_xO_y$(10) |

TABLE 2

| Film | Target | Gas | Pressure (Torr) |
|---|---|---|---|
| $ZnAl_xO_y$ | Zn-3 at % Al | Ar + $O_2$ | $2.0 \times 10^{-3}$ |
| C:$ZnAl_xO_y$ | Zn-3 at % Al | $CO_2$ | $2.0 \times 10^{-3}$ |
| ZnO | Zn | Ar + $O_2$ | $2.0 \times 10^{-3}$ |
| C:ZnO | Zn | $CO_2$ | $2.0 \times 10^{-3}$ |
| Zn—Al | Zn-3 at % Al | Ar | $2.0 \times 10^{-3}$ |
| Zn | Zn | Ar | $2.0 \times 10^{-3}$ |
| Ag—Pd | Ag-1 at % Pd | Ar | $2.0 \times 10^{-3}$ |
| Ag | Ag | Ar | $2.0 \times 10^{-3}$ |
| Ti | Ti | Ar | $2.0 \times 10^{-3}$ |
| $SnSi_xO_y$ | Sn-50 at % Si | Ar + $O_2$ | $2.0 \times 10^{-3}$ |
| C:$SnSi_xO_y$ | Sn-50 at % Si | $CO_2$ | $2.0 \times 10^{-3}$ |

TABLE 3

| | 7th day | 14th day | 21st day |
|---|---|---|---|
| Example 4 | 7 | 15 | 18 |
| example 5 | 6 | 12 | 15 |
| Comparative Example 3 | 15 | 29 | 38 |
| Example 8 | 1 | 4 | 5 |
| Example 9 | 1 | 5 | 7 |
| Comparative Example 6 | 10 | 17 | 21 |

EXAMPLES 8 AND 9 AND COMPARATIVE EXAMPLE 6

Using an in-line sputtering apparatus with a target size of 2,500 mm×300 mm, three layers of a C:$ZnAl_xO_y$ film (14 nm), a Ag film (10 nm) and a C:$ZnAl_xO_y$ film (38 nm) were sequentially formed on a glass substrate of 2,400 mm×1,600 mm×3 mm in thickness transported on a conveyor in a single pass in one direction. The C:$ZnAl_xO_y$ films of the first and third layers were formed by reactive sputtering in a $CO_2$ atmosphere using a target having 3 atomic % of Al incorporated in Zn.

Further, between the Ag layer and the C:$ZnAl_xO_y$ film of the third layer, an Al-containing Zn barrier layer having a thickness of 2 nm was inserted by sputtering in an Ar atmosphere using a target having 3 atomic % of Al incorporated in Zn.

For the formation of the C:$ZnAl_xO_y$ films, two targets were used for each layer. The discharge power at that time was from 15 to 20 kW/target, and as the sputtering gas, $CO_2$ gas was used alone and introduced in an amount of 600 sccm/target. The sputtering pressure at that time was $2\times10^{-3}$ Torr. With respect to the Ag layer and the Zn barrier layer, Ar gas was introduced to each target in an amount of 600 sccm, and sputtering was carried out with a discharge power of 6 kW and 2 kW, respectively. The transporting speed of the substrate was 1.0 m/min (Example 8).

Using the same apparatus as in Example 8, five layers of a C:$ZnAl_xO_y$ film (31 nm), a Ag film (10 nm), a C:$ZnAl_xO_y$ film (62 nm), a Ag film (10 nm) and a C:$ZnAl_xO_y$ film (24 nm) were laminated on the same substrate as used in Example 8. The condition for forming each film was the same as in Example 8. Between the Ag film of the second layer and the C:$ZnAl_xO_y$ film of the third layer and between the Ag film of the fourth layer and the C:$ZnAl_xO_y$ film of the fifth layer, the same Al-containing Zn barrier layers as in Example 8 were respectively inserted (Example 9).

As a Comparative Example, a laminate with three films was prepared under the same condition as in Example 8 except that for the film formation of the $ZnAl_xO_y$ films of the first and third layers, a gas mixture of 150 sccm of Ar gas and 450 sccm of $O_2$ gas was used instead of $CO_2$ gas (Comparative Example 6).

With respect to Examples 8 and 9, for 1 week after initiation of the sputtering, no formation of a powder was observed, and film forming was continuously and constantly carried out without arcing. With respect to Comparative Example 6, upon expiration of 2 days after initiation of the sputtering, a powder started to form on the target surface, and consequently, arcing started to occur frequently, and upon expiration of 3 days, it was no longer possible to continue the film forming.

With respect to Examples 8 and 9 and Comparative Example 6, the same constant temperature and humidity test as described above, was carried out, and the results are shown in Table 3.

Using the above in-line sputtering apparatus, a C:$ZnAl_xO_y$ film having a film thickness of 1 $\mu$m was formed on a Ni film instead of the glass substrate, under the same condition as in Example 8, and with respect to the sample thereby obtained, the amount of carbon taken into the film was measured by means of a CS (carbon sulfur simultaneous) analyzer (EMIA-820, manufactured by Horiba Seisakusho K.K.), whereby it was about 3.2 atomic % (content of carbon to Zn).

EXAMPLE 10 AND COMPARATIVE EXAMPLE 7

Figure 15:
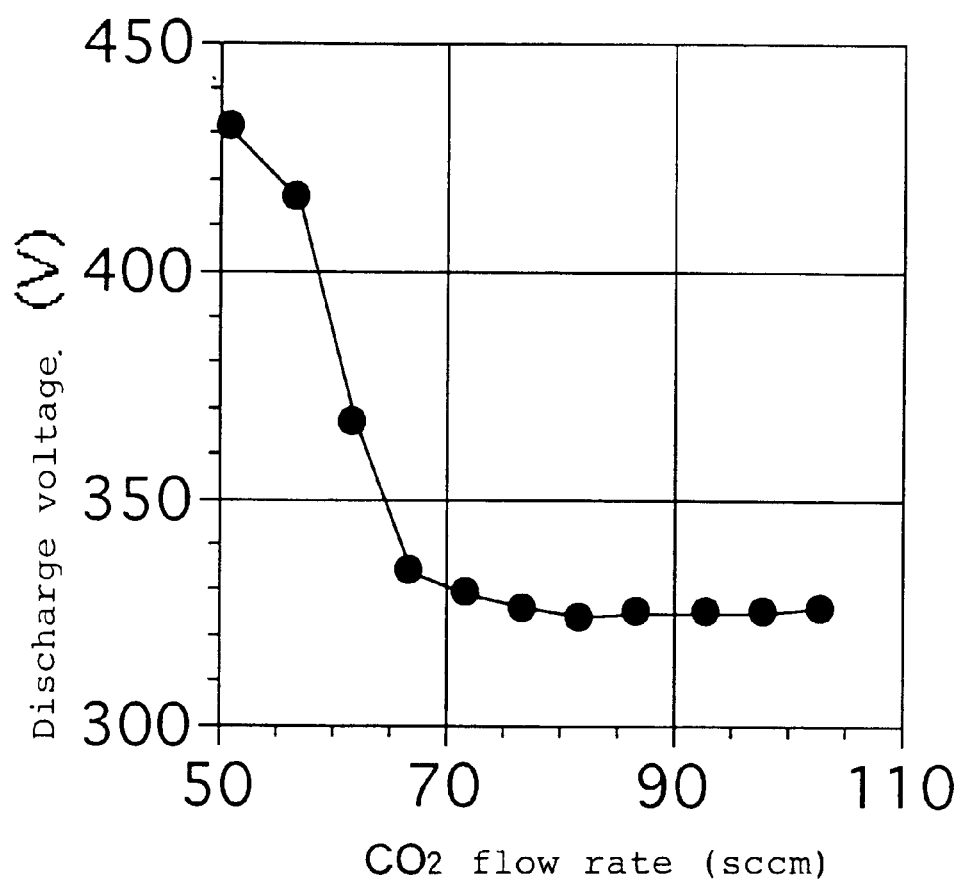
FIG. 15 is a graph showing a relation between the $CO_2$ flow rate and the discharge voltage in Example 10.

Using the same apparatus as used in Example 1, a C:$ZnAl_xO_y$ film having a film thickness of 100 nm was formed by DC sputtering on a substrate of thoroughly cleaned soda lime silica glass (10 cm×10 cm×2 mm in thickness) using a target having 5 atomic % of Al incorporated to Zn in an atmosphere of 100% $CO_2$. The amount of $CO_2$ introduced was 82, 92 or 103 sccm, and the sputtering pressure at that time was $3.2\times10^{-3}$ Torr, $3.8\times10^{-3}$ Torr or $4.4\times10^{-3}$ Torr, respectively. The change in the discharge voltage when the flow rate of $CO_2$ was changed, is shown in FIG. 15.

As a comparative sample, film forming was carried out under the same condition except that sputtering was carried out in an atmosphere of 100% $O_2$ as the prior art. The film forming was carried out by introducing $O_2$ in an amount of 100 sccm, and the pressure during the sputtering was $3.8\times10^{-3}$ Torr.

Figure 16:
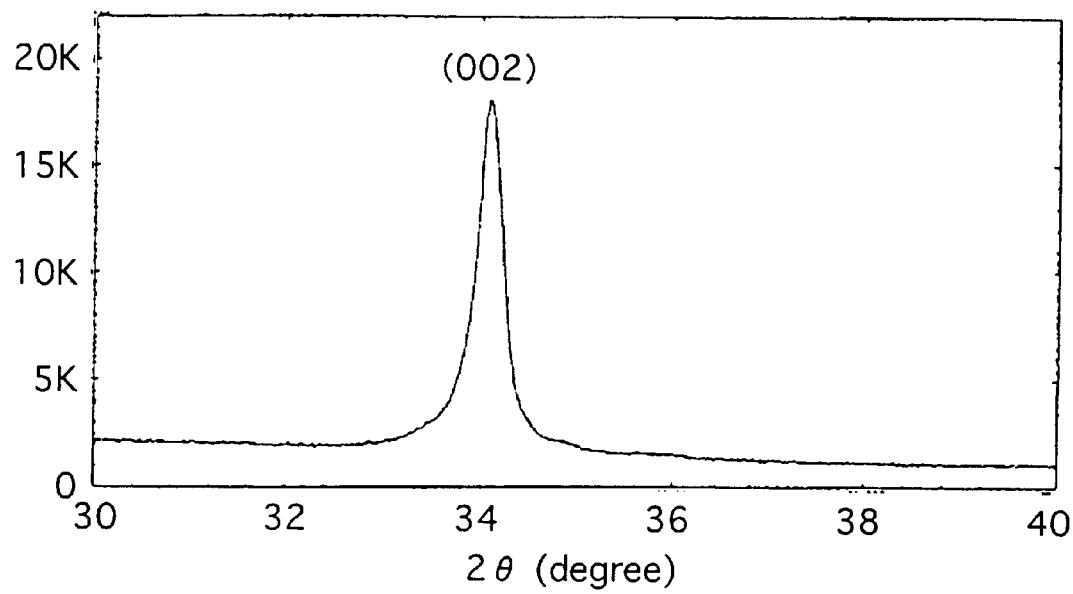
FIG. 16 shows a peak profile of X-ray diffraction of the oxide film of Example 10.
Figure 17:
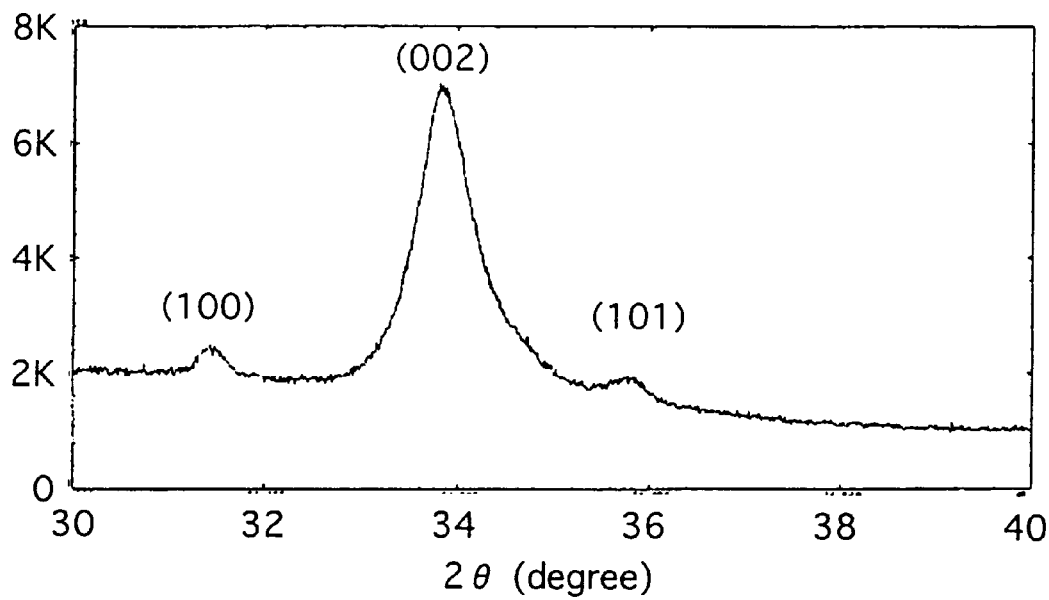
FIG. 17 shows a peak profile of X-ray diffraction of the oxide film of Comparative Example 7.

The peak profiles of X-ray diffraction of the prepared samples are shown in FIGS. 16 and 17. When $O_2$ gas was used as the sputtering gas, peaks corresponding to three plane directions of (100), (002) and (101) were detected. Whereas, when $CO_2$ was used, only a peak from the (002) plane was detected, thus indicating a single orientation. Further, the peak intensity was strong, and the half value width was small, and the crystallizability was good.

Table 4 shows the refractive indices and resistivity. As the flow rate of $CO_2$ increases, the refractive index tends to decrease, and the resistivity increases. Further, with the C:$ZnAl_xO_y$ film, the refractive index was equal or slightly small, and the specific resistance tends to be small, as compared with the $ZnAl_xO_y$ film obtained by $O_2$ gas sputtering. Such differences in the refractive index and the resistivity due to the sputtering gas species are believed to be attributable to the above-mentioned crystallizability and the amount of C contained in the film.

EXAMPLE 11 AND COMPARATIVE EXAMPLE 8

In the same manner as in Example 9, a C:$ZnAl_xO_y$ film (38 nm), a Ag film (10 nm), a Zn—Al film (barrier layer) and a C:$ZnAl_xO_y$ film (38 nm) were sequentially formed by DC sputtering. The C:$ZnAl_xO_y$ films of the first and third layers were formed by using a target having 5 atomic % of Al incorporated to Zn in an atmosphere of 100% $CO_2$ with the amount of $CO_2$ introduced being 92 sccm. The Zn—Al film was formed in an Ar atmosphere using a target having 5 atomic % of Al incorporated to Zn.

As a Comparative Example, a laminate having the same construction as in Example 11 was prepared in the same manner except that the $ZnAl_xO_y$ films were formed by using a 100% $O_2$ gas with the amount of $O_2$ gas introduced being 100 sccm instead of $CO_2$.

Figure 18:
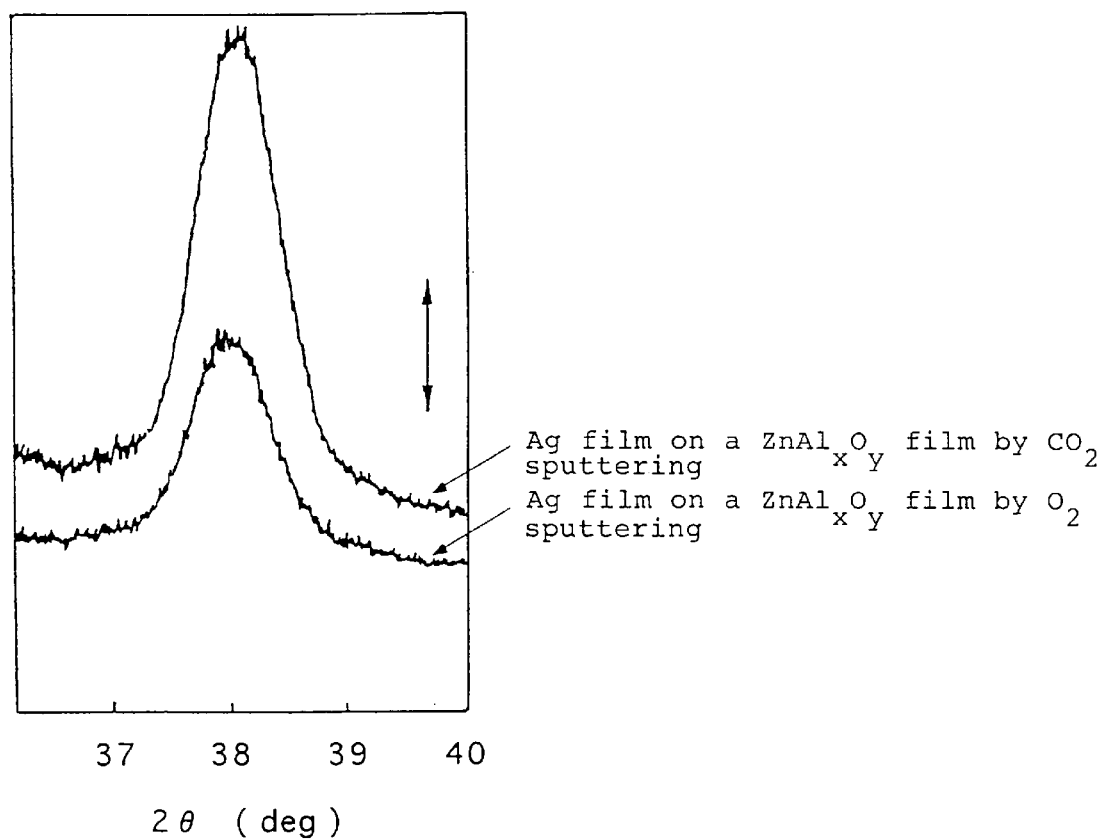
FIG. 18 shows peak profiles of X-ray diffraction of the Ag films of Example 11 and Comparative Example 8.
Figure 19:
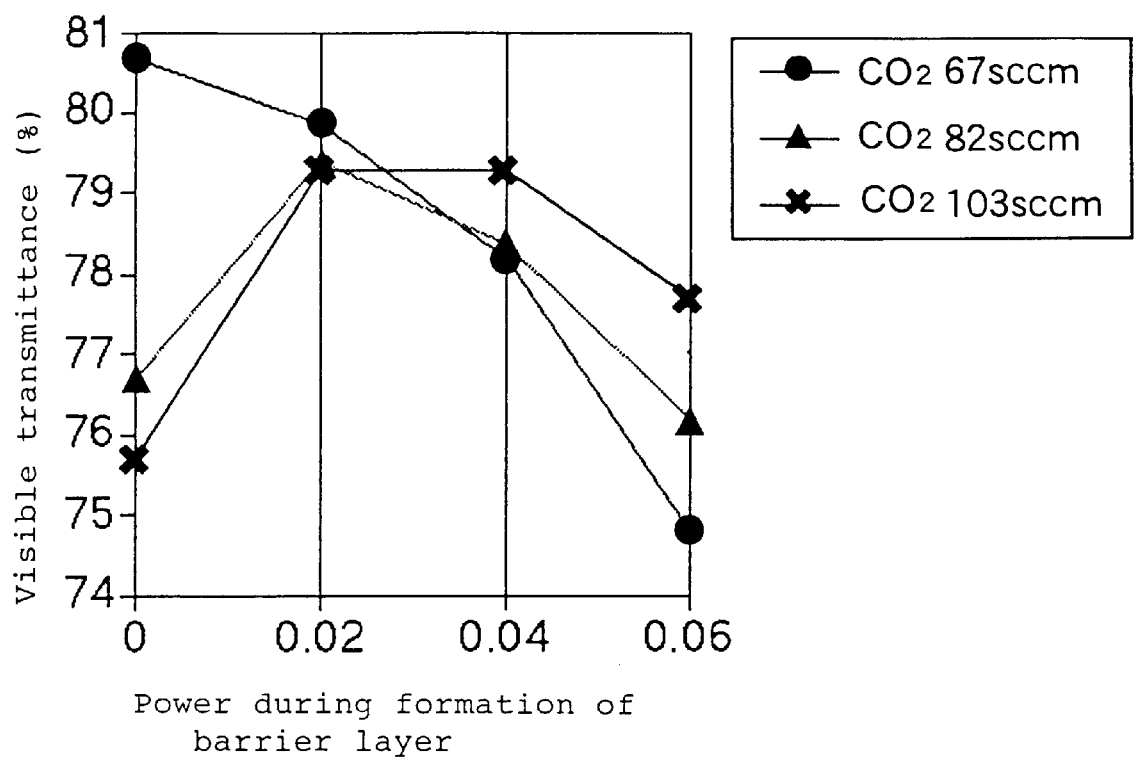
FIG. 19 is a graph showing a relation between the $CO_2$ flow rate and the visible ray transmittance.

The peak profiles of X-ray diffraction are shown in FIG. 18. It is apparent from the Figure that in the Ag film laminated on the C:$ZnAl_xO_y$ film having good crystallizability, the crystal growth is promoted, and it shows a stronger peak intensity than the Ag film laminated on the $ZnAl_xO_y$ film formed by $O_2$ sputtering.

With respect to these samples, moisture resistance tests were carried out, and the results are shown in Table 5. With the Ag film laminated on the C:$ZnAl_xO_y$ film, the crystallizability is good, and the Ag film is accordingly stabilized, and the moisture resistance is superior, as compared with the Ag film laminated on the $ZnAl_xO_y$ film formed by $O_2$ sputtering.

EXAMPLE 12 AND COMPARATIVE EXAMPLE 9

In the same manner as in Example 10, a C:$ZnAl_xO_y$ film (16 nm), a Ag film (10 nm), a Zn—Al film (barrier layer), and a C:$ZnAl_xO_y$ film (38 nm) were formed sequentially from the substrate side. However, while maintaining the pumping speed rate to be constant, the amount of $CO_2$ introduced was varied at a level of 67 sccm, 82 sccm or 103 sccm. The sputtering pressure at that time was $3.2\times10^{-3}$, $3.8\times10^{-3}$ or $4.4\times10^{-3}$ Torr, respectively. Further, in order to change the film thickness of the barrier layer within a range of from 0 to 5 nm, the applied power during sputtering was changed under 4 conditions of 0, 0.02, 0.04 and 0.06 kW while setting the film forming time to be constant. Here, 0 kW of the applied power is meant for no barrier layer.

With respect to a series of samples thereby obtained, the flow rate of $CO_2$ during film formation of the $C:ZnAl_xO_y$ and Tv of the three layer laminate obtained by the power applied during the barrier layer formation, are shown in Table 19. In a case where the flow rate of $CO_2$ during the film formation of $C:ZnAl_xO_y$ is 82 sccm or 103 sccm, if there is no barrier layer, the Ag film is oxidized during lamination of the $C:ZnAl_xO_y$ film of the third layer, whereby the resulting three layer film will have low Tv and high sheet resistance. As the thickness of the barrier layer increases, Tv will increase, and the sheet resistance will decrease at the same time. The highest Tv and the lowest sheet resistance can be obtained when the applied power is 0.02 kW or 0.04 kW. If the thickness of the barrier layer is further increased, a part of the barrier layer is likely to remain non-oxidized, whereby Tv tends to decrease.

In a case where the flow rate is 67 sccm, the highest Tv and the lowest sheet resistance can be obtained when there is no barrier layer. The condition of the flow rate being 67 sccm corresponds to the condition immediately after the resulting $C:ZnAl_xO_y$ film has changed from a slightly absorbing film to a transparent film (i.e. the sputtering condition of a so-called transition region), where the oxidizing power of the atmosphere is not excessive, and the Ag film is not subjected to oxidation.

In a case where the flow rate was less than 62 sccm, the oxidizing power was inadequate, and the resulting $C:ZnI_xO_y$ film was a slightly absorbing film.

As described above, by selecting a sputtering condition for the transition region by adjusting the flow rate of $CO_2$ when a $C:ZnI_xO_y$ film is formed on a Ag film, lamination can be carried out without oxidizing the Ag film even in the absence of a barrier layer.

EXAMPLE 13 AND COMPARATIVE EXAMPLE 10

In the same manner as in Example 11, a $C:ZnAl_xO_y$ film (16 nm), a Ag film (10 nm) and a $C:ZnAl_xO_y$ film (38 nm) were formed sequentially from the substrate side. For the formation of the $C:ZnAl_xO_y$ films, a target having 3 atomic % of Al incorporated to Zn, was used. For all of the first to third layers, the sputtering gas used was a gas mixture comprising 20% of Ar and 80% of $CO_2$.

As a comparative sample, a laminate was prepared to have the same film thickness construction as in the above Example except that the sputtering atmosphere for the Ag film of the second layer was changed to an Ar atmosphere as the prior art.

With respect to these samples, Tv and the emissivity $\epsilon$ thereof are summarized in Table 6.

It is apparent from Table 6 that even if the sputtering atmosphere for the Ag film of the second layer is different, Tv and $\epsilon$ are equivalent within an error range. Namely, if a proper ratio of Ar gas and $CO_2$ gas is selected, a Low-E film can be formed continuously in the same gas atmosphere in one continuous chamber without providing a gate valve or a buffer chamber equipped with an orifice for gas separation.

TABLE 4

| Sputtering gas | Refractive index | Resistivity ($\Omega \cdot cm$) |
| --- | --- | --- |
| $CO_2$ 82 sccm | 2.002 | $2.67 \times 10^{-2}$ |
| $CO_2$ 92 sccm | 1.983 | $1.81 \times 10^{-1}$ |
| $CO_2$ 103 sccm | 1.978 | $5.30 \times 10^{-1}$ |
| $O_2$ 100 sccm | 2.004 | Not measurable (at least $1 \times 10^6$) |

TABLE 5

| Sputtering gas | Results of moisture test |
| --- | --- |
| 100% $CO_2$ gas | No turbidity Formation of spots having a diameter of about 1 mm |
| 100% $O_2$ gas | Slight turbidity over the entire surface Formation of spots having a diameter of at least 2 mm |

TABLE 6

| Sputtering gas | Tv | $\epsilon$ |
| --- | --- | --- |
| Ar/$CO_2$ | 78.2% | 0.12 |
| Ar | 78.4% | 0.12 |

EXAMPLE 14 AND COMPARATIVE EXAMPLE 11

Using a sputtering apparatus with a target size of 4 inches, a C:ITO film was formed on a substrate of thoroughly cleaned soda lime silica glass (10 cm×10 cm×2 mm in thickness) in an atmosphere of a gas mixture of Ar and $CO_2$ (Example 14).

As the target, an In—Sn alloy target (containing 10 wt % of Sn as calculated as Sn oxide, hereinafter referred to as an In-10Sn target) was used, the applied power was 100 W, the total flow rate of the gas introduced was 30 sccm, the sputtering pressure was $3 \times 10^{-3}$ Torr, the temperature for heating the substrate was 250° C., and the film-forming time was 5 minutes.

Figure 11:
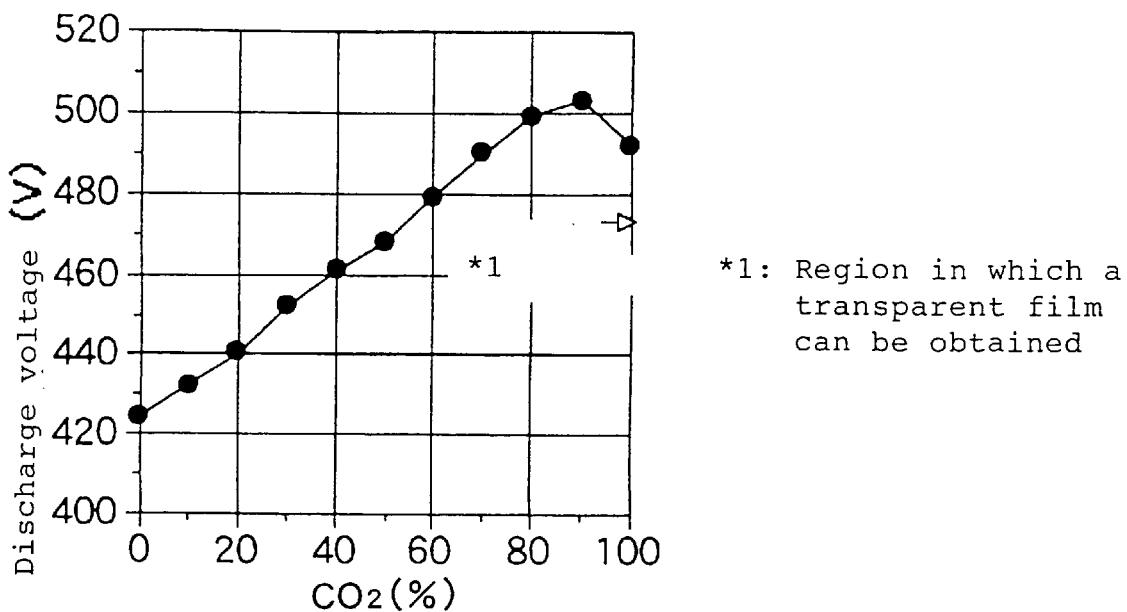
FIG. 11 is a graph showing a relation between the $CO_2$ flow rate ratio and the discharge voltage.
Figure 12:
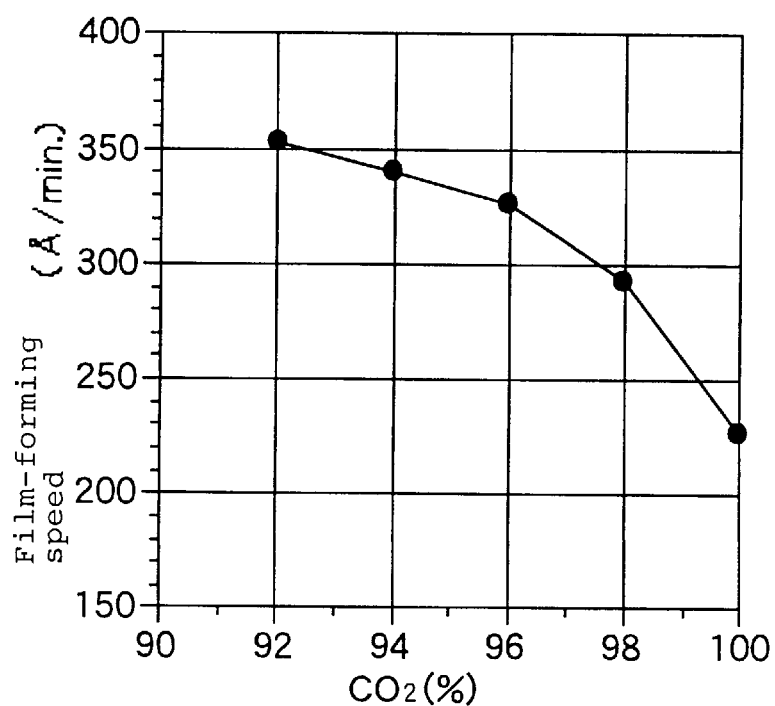
FIG. 12 is a graph showing a relation between the $CO_2$ flow rate ratio and the film-forming speed.

FIG. 11 shows a relation between the flow rate ratio of $CO_2$ and the discharge voltage. FIG. 12 shows a relation between the flow rate ratio of $CO_2$ and the film-forming speed of a transparent film. FIG. 9 shows a relation between the flow rate ratio of $CO_2$ and the resistivity of a transparent film.

With respect to the carbon concentration in the C:ITO film, to remove the influence of carbon adsorbed on the film surface, the surface was digged for about 100 Å by Ar ion etching, whereupon the carbon concentration was analyzed by an ESCA method. As a result, the carbon concentration was from 1.9 to 2.2 atomic %.

An ITO film was formed in the same manner as in Example 14 except that the atmosphere in Example 14 was changed to an atmosphere of a gas mixture of Ar and $O_2$ (Comparative Example 11).

Figure 13:
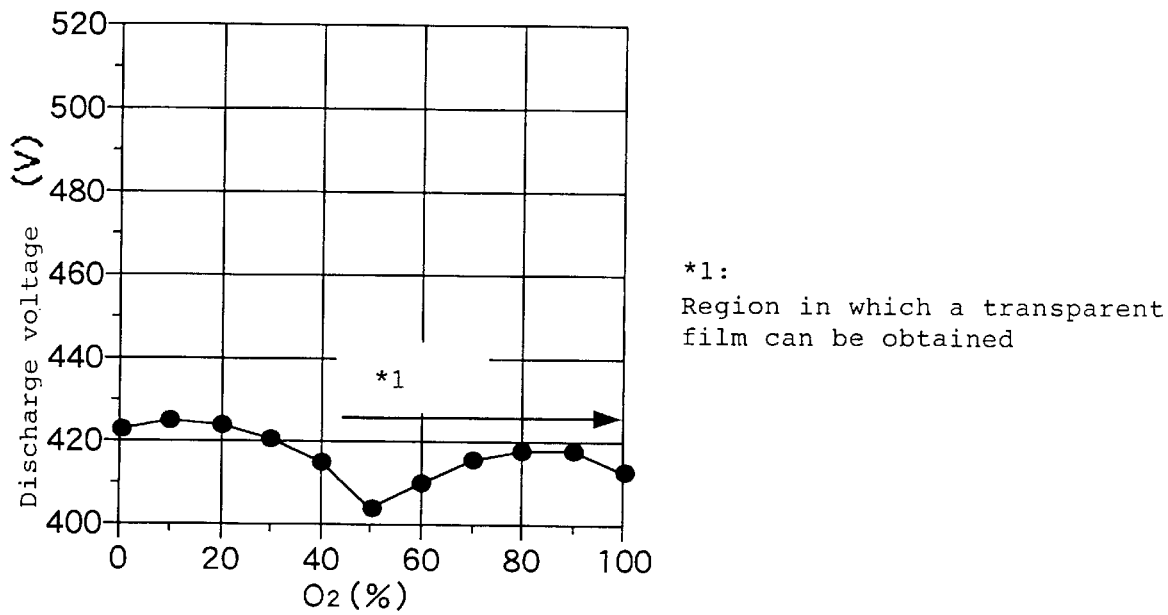
FIG. 13 is a graph showing a relation between the $O_2$ flow rate ratio and the discharge voltage.
Figure 14:
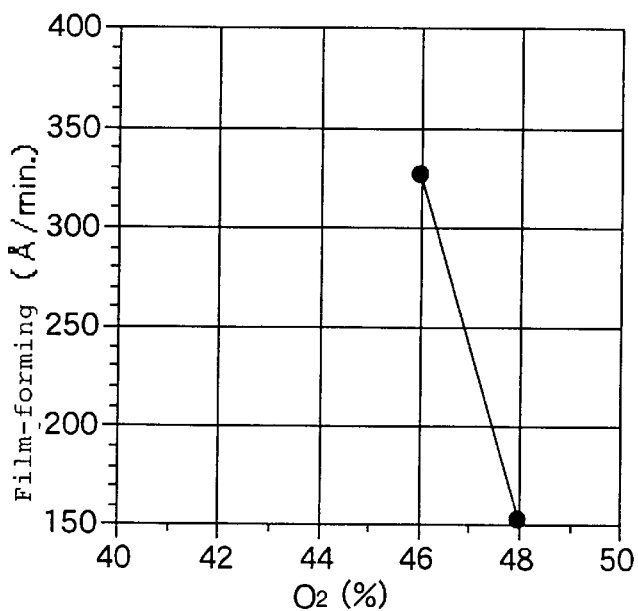
FIG. 14 is a graph showing a relation between the $O_2$ flow rate ratio and the film-forming speed.

FIG. 13 shows a relation between the flow rate ratio of $O_2$ and the discharge voltage. FIG. 14 shows a relation between the flow rate ratio of $O_2$ and the film-forming speed of a transparent film. FIG. 10 shows a relation between the flow rate ratio of $O_2$ and the resistivity of a transparent film.

When FIGS. 11 and 13 are compared, the discharge voltage characteristics are different, and when $CO_2$ was used, the oxidizing gas ratio required to obtain a transparent film was larger. This is believed to be attributable to the fact that $CO_2$ has an oxidizing power smaller than $O_2$, and the reaction takes place mildly relative to the oxidizing gas ratio.

Further, from comparison between FIGS. 12 and 14 and between FIGS. 9 and 10, it is evident that when $CO_2$ is used, the changes in the film-forming speed and the resistivity to the oxidizing gas ratio are small, and a transparent conductive film can be obtained in a wider range of the gas ratio.

Further, with respect to the C:ITO film of Example 14, the in-plane distribution and the reproducibility were examined, whereby good results were obtained. Further, it was confirmed that films having higher electrical conductivity can be selectively formed under good controllability. These effects are believed to be attributable to the fact that the reaction takes place mildly relative to the oxidizing gas ratio.

EXAMPLE 15

By DC sputtering, a C:ITO film was formed on a soda lime glass substrate (100 cm×100 cm×2 mm in thickness) in an atmosphere of a gas mixture of Ar and $CO_2$.

As the target, an In-10Sn target was used, the applied power was 2.2 kW, the total flow rate of the gas introduced was 300 sccm, the sputtering pressure was $3\times10^{-3}$ Torr, the temperature for heating the substrate was 250° C., the film was formed while transporting the substrate below the target, and the speed for transporting the substrate was determined so that the film-forming time would be 5 minutes.

The obtained C:ITO film was excellent, whereby the in-plane uniformity of the resistivity was ±3%, and the variation in the resistance among different batches (film formation of 5 times) was ±5%. Further, the in-plane uniformity of optical properties was good.

Further, during the film formation, formation of nodules was reduced, no substantial formation of pin holes due to arcing was observed, and stopping of the sputtering power source by a protective circuit was not observed.

EXAMPLE 16

Using a sputtering apparatus with a target size of 4 inches, a C:ITO film was formed in an atmosphere of a gas mixture of Ar and $CO_2$ on a substrate prepared by thoroughly cleaning a substrate of soda lime silica glass (10 cm×10 cm×1.1 mm in thickness) having a $SiO_2$ film formed thereon as an alkali barrier coat by a CVD method. Then, patterning was carried out to form a transparent electrode for a touch panel.

As the target, an In-10Sn target was used, the applied power was 100 W, the total flow rate of the gas introduced was 30 sccm, the sputtering pressure was $3\times10^{-3}$ Torr, the temperature for heating the substrate was 400° C., and the film thickness was 10 nm.

The patterning was carried out by coating a resist on the C-ITO film, followed by dipping in an iron chloride type etchant using it as a mask.

The obtained transparent electrode for a touch panel showed a good sheet resistance at a level of 200 Ω/□.

EXAMPLE 17

A transparent electrode for a liquid display device was prepared in the same manner as in Example 16 except that the film thickness was changed to 100 nm. The obtained transparent electrode for a liquid crystal display device showed a good sheet resistance at a level of 20 Ω/□.

When the oxide film of the present invention is used as the uppermost layer of a laminate, moisture scarcely penetrates or diffuses thereinto, whereby the metal layer constituting the laminate is less susceptible to the influence of moisture of the external atmosphere, whereby the moisture resistance will be improved. This is especially suitable for a Low-E film.

Further, according to the present invention, the following effects 1) to 7) will be obtained.

1) It is possible to obtain an oxide film densified with uniform crystal growth direction of the film and having the internal stress reduced.

2) It is possible to obtain a transparent oxide film constantly at the maximum film-forming speed.

3) Oxidation of a metal layer such as a Ag layer can be suppressed, whereby a visible light transmittance higher than the conventional method can be obtained. It is possible to laminate an oxide film on a metal layer even in the absence of a barrier layer (a layer to prevent oxidation of a metal layer) which used to be required, whereby the process for producing a Low-E film can be simplified.

4) The barrier layer is usually a metal film (Zn or Sn). The adhesion between the barrier layer and a metal film such as a Ag film is weak as compared with the adhesion between an oxide film (ZnO or $SnO_2$) and a metal film such as a Ag film. Accordingly, if the barrier layer remains without being fully oxidized, the scratch resistance tends to be low. Such a barrier layer can be omitted by the present invention, whereby a Low-E film having excellent scratch resistance can readily be prepared.

5) The frequency of arcing will decrease in the continuous film forming as compared with a case where sputtering is carried out by a conventional method (in an atmosphere of a gas mixture of Ar gas and $O_2$ gas, or $O_2$ gas only). The time for the continuous production can be prolonged, and defects in the product such as pin holes can be reduced.

6) It is possible to form an oxide film by sputtering on a substrate which is likely to be deteriorated when exposed to oxidizing plasma, such as a plastic substrate represented by an acrylic resin plate or a polycarbonate resin plate or a substrate having a resin coated on its surface. For example, an undercoating layer ($SiO_2$ or a $Al_2O_3$) which is effective for suppressing diffusion of a gas through a plastic, can be formed while preventing a damage to the substrate.

7) It is possible to produce a transparent conductive film having a uniform in-plane distribution of electrical properties and optical properties constantly with good productivity, and formation of nodules during the film formation can be reduced.

What is claimed is:

1. A method for producing a laminate comprising oxide films and metal film(s) alternately laminated in a total of (2n+1) layers (n≧1) on a substrate, wherein the oxide films comprise carbon, and as the main component, an oxide of at least one metal selected from the group consisting of Zn, Sn, In, Al and Ti; the metal film(s) are metal film(s) comprising Ag as the main component; said method comprising forming at least the oxide films on the metal film(s) by a sputtering process using a target comprising, as the main component, at least one metal selected from the group of Zn, Sn, In, Al and Ti, the sputtering being carried out in a $CO_2$-containing atmosphere.

2. The method for producing a laminate according to claim 1, wherein the target comprises at least one metal selected from the group consisting of Zn, Sn and In.

3. The method according to claim 1, wherein the metal film(s) comprising Ag as the main component further contain(s) at least one metal selected from the group consisting of Pd, Au and Cu.

4. The method according to claim 1, wherein the laminate comprises three layers of oxide film/metal film/oxide film, or five layers of oxide film/metal film/oxide film/metal film/oxide film.

5. Tile method according to claim 1, wherein an overcoat film comprising an oxide of Sn as the main component and containing from 5 to 95 atomic % of Si based on the total amount of Sn and Si, is formed on the oxide film of the (2n+1)th layer of the laminate.

6. The method according to claim 5, wherein the overcoat film contains from 0.03 to 15 atomic % of carbon to Sn.

* * * * *